(12) United States Patent
Machida et al.

(10) Patent No.: US 12,482,729 B2
(45) Date of Patent: Nov. 25, 2025

(54) SEMICONDUCTOR DEVICE

(71) Applicants: TAMURA CORPORATION, Tokyo (JP); Novel Crystal Technology, Inc., Saitama (JP)

(72) Inventors: Nobuo Machida, Saitama (JP); Kohei Sasaki, Saitama (JP)

(73) Assignees: Tamura Corporation, Tokyo (JP); Novel Crystal Technology, Inc., Saitama (JP)

( * ) Notice: Subject to any disclaimer, the term of this patent is extended or adjusted under 35 U.S.C. 154(b) by 636 days.

(21) Appl. No.: 17/788,860

(22) PCT Filed: Dec. 21, 2020

(86) PCT No.: PCT/JP2020/047652
§ 371 (c)(1),
(2) Date: Jun. 24, 2022

(87) PCT Pub. No.: WO2021/132144
PCT Pub. Date: Jul. 1, 2021

(65) Prior Publication Data
US 2023/0034806 A1 Feb. 2, 2023

(30) Foreign Application Priority Data
Dec. 26, 2019 (JP) .................. 2019-236007

(51) Int. Cl.
*H01L 23/495* (2006.01)
*H01L 23/00* (2006.01)
*H10D 8/60* (2025.01)

(52) U.S. Cl.
CPC .. *H01L 23/49562* (2013.01); *H01L 23/49568* (2013.01); *H01L 24/48* (2013.01); *H01L 2224/48463* (2013.01); *H10D 8/60* (2025.01)

(58) Field of Classification Search
CPC ........... H01L 29/8725; H01L 23/49513; H01L 29/872; H01L 23/49562; H01L 29/402;
(Continued)

(56) References Cited

U.S. PATENT DOCUMENTS 7,834,433 B2 * 11/2010 Xiaochun ......... H01L 23/49524
257/796
9,299,679 B2 * 3/2016 Yang ..................... H01L 24/33
(Continued)

FOREIGN PATENT DOCUMENTS

CN 109923678 A 6/2019
CN 110504327 A 11/2019
(Continued)

OTHER PUBLICATIONS

Translation of International Preliminary Report Report on Patentability and Written Opinion dated Jul. 7, 2022 received in International Application No. PCT/JP2020/047652.
(Continued)

*Primary Examiner* — Mouloucoulaye Inoussa
(74) *Attorney, Agent, or Firm* — Scully, Scott, Murphy & Presser, PC

(57) ABSTRACT

A semiconductor device includes a lead frame including a raised portion on a surface, and a semiconductor element that is face-down mounted on the lead frame and includes a substrate including a $Ga_2O_3$-based semiconductor, an epitaxial layer including a $Ga_2O_3$-based semiconductor and stacked on the substrate, a first electrode connected to a surface of the substrate on an opposite side to the epitaxial layer, and a second electrode connected to a surface of the epitaxial layer on an opposite side to the substrate and including a field plate portion at an outer peripheral portion. The semiconductor element is fixed onto the raised portion. An outer peripheral portion of the epitaxial layer, which is (Continued)

located on the outer side of the field plate portion, is located directly above a flat portion of the lead frame that is a portion at which the raised portion is not provided.

13 Claims, 11 Drawing Sheets

(58) Field of Classification Search
CPC . H01L 29/24; H01L 29/417; H01L 23/49548; H01L 24/48; H01L 23/49568; H01L 29/0649; H01L 23/3675; H01L 29/045; H01L 21/02565; H01L 21/0262; H01L 21/02628; H01L 21/02433; H01L 21/02609; H01L 23/473; H01L 21/0242; H01L 29/7828; H01L 29/66712; H01L 23/49575; H01L 29/7395; H01L 23/4334; H01L 29/0619; H01L 2224/48463; H01L 2224/83385; H01L 2224/48247; H01L 2924/181; H01L 2224/32245; H01L 2924/00012; H01L 2221/68377; H01L 2221/68327; H01L 2224/05624; H01L 2224/291; H01L 2224/37124; H01L 2224/40247; H01L 2224/45015; H01L 2224/84444; H01L 2224/06181; H01L 2221/68372; H10D 8/60; H10D 64/62; H10D 99/00; H10D 62/80; H10D 62/405; H10D 12/441; H10D 30/668; H02M 3/33569; C30B 25/02; C30B 29/16
See application file for complete search history.

(56) References Cited

U.S. PATENT DOCUMENTS

| | | | |
|---|---|---|---|
| 10,840,384 B2 | 11/2020 | Hirabayashi et al. | |
| 2007/0284606 A1* | 12/2007 | Sugimori | H10H 29/10 257/E33.076 |
| 2008/0142795 A1* | 6/2008 | Ichinose | A45F 3/166 257/E29.1 |
| 2011/0291245 A1* | 12/2011 | Feng | H01L 24/06 257/E21.597 |
| 2012/0153317 A1* | 6/2012 | Emerson | H01L 25/0753 257/89 |
| 2012/0205661 A1* | 8/2012 | Kyono | H10H 20/01335 257/E29.089 |
| 2013/0299848 A1* | 11/2013 | Fuergut | H01L 23/4824 257/E27.012 |
| 2014/0001615 A1* | 1/2014 | Otremba | H01L 23/49537 257/676 |
| 2014/0110828 A1* | 4/2014 | Otremba | H01L 23/49562 438/122 |
| 2014/0232015 A1* | 8/2014 | Otremba | H01L 23/49513 257/777 |
| 2014/0239452 A1* | 8/2014 | Sasaki | C30B 29/68 423/624 |
| 2014/0332823 A1* | 11/2014 | Takizawa | H10D 62/80 257/76 |
| 2015/0043601 A1* | 2/2015 | Hamaguchi | H01S 5/18391 372/44.01 |
| 2015/0043606 A1* | 2/2015 | Hamaguchi | H01S 5/18391 438/29 |
| 2015/0044795 A1* | 2/2015 | Futagawa | H01S 5/04253 438/29 |
| 2015/0249189 A1* | 9/2015 | Sato | H01L 21/02414 257/43 |
| 2015/0349063 A1* | 12/2015 | Kiyama | H10D 30/6738 257/615 |
| 2017/0179249 A1* | 6/2017 | Oda | H01L 29/47 |
| 2018/0114744 A1 | 4/2018 | Brandl et al. | |
| 2018/0254355 A1* | 9/2018 | Sasaki | H01L 21/02433 |
| 2020/0013859 A1* | 1/2020 | Schaeffer | H01L 21/78 |
| 2020/0058804 A1* | 2/2020 | Hirabayashi | H01L 29/24 |
| 2020/0111882 A1* | 4/2020 | Hirabayashi | H10D 62/10 |
| 2020/0211919 A1* | 7/2020 | Takahashi | H10D 30/0245 |
| 2020/0212184 A1* | 7/2020 | Takahashi | H01L 29/7787 |
| 2020/0373227 A1* | 11/2020 | Futamura | H01L 24/06 |
| 2021/0043778 A1* | 2/2021 | Lv | H10D 99/00 |
| 2021/0217869 A1* | 7/2021 | Kanno | H01L 29/872 |
| 2021/0296448 A1 | 9/2021 | Kawakami et al. | |
| 2022/0223682 A1* | 7/2022 | Imafuji | H10D 62/10 |
| 2022/0223746 A1* | 7/2022 | Rim | H10D 64/64 |
| 2022/0231174 A1* | 7/2022 | Imafuji | H01L 29/0657 |
| 2024/0021669 A1* | 1/2024 | Takahashi | H01L 29/045 |

FOREIGN PATENT DOCUMENTS

| | | |
|---|---|---|
| EP | 2 851 946 A1 | 3/2015 |
| EP | 3 540 784 A1 | 9/2019 |
| JP | 2004-214368 A | 7/2004 |
| JP | 2008-085190 A | 4/2008 |
| JP | 2017-45969 A | 3/2017 |
| JP | 2018-78177 A | 5/2018 |
| JP | 6563093 B1 | 8/2019 |

OTHER PUBLICATIONS

Extended European Search Report dated Dec. 21, 2023 from related EP 20 90 5852.8.
International Search Report dated Mar. 9, 2021 received in International Application No. PCT/JP2020/047652, together with an English language translation.
Japanese Official Action dated Aug. 1, 2023 from related JP 2019-236007 together with an English language translation.
Official Action dated Feb. 12, 2025 received from the China National Intellectual Property Administration in related application CN 202080090359.6 together with English language translation.

* cited by examiner

SEMICONDUCTOR DEVICE

TECHNICAL FIELD

The present invention relates to a semiconductor device.

BACKGROUND ART

Semiconductor packages in which a vertical Schottky barrier diode is connected onto a lead frame are known (see, e.g., Patent Literature 1).

The Schottky barrier diode described in Patent Literature 1 has a SiC semiconductor substrate and a SiC epitaxial layer formed thereon, and is configured such that an electrode provided on the SiC semiconductor substrate is connected to a pad portion of a lead frame through a conductive bonding material, and an electrode provided on the SiC epitaxial layer is connected to a terminal of the lead frame via a conductive wire.

CITATION LIST

Patent Literatures

Patent Literature 1: JP 6,563,093 B

SUMMARY OF INVENTION

Technical Problem

According to Patent Literature 1, semiconductor materials different from SiC, such as GaN or $Ga_2O_3$, may be used. However, when the substrate of the Schottky barrier diode is formed of a material with low thermal conductivity, such as $Ga_2O_3$, heat dissipation is poor since heat generated in the epitaxial layer during operation of the Schottky barrier diode cannot be efficiently transferred to the lead frame, which adversely affects the operation of the Schottky barrier diode.

It is an object of the invention to provide a semiconductor device in which a vertical semiconductor element formed using a $Ga_2O_3$-based semiconductor as a material of a substrate and an epitaxial layer material is mounted on a lead frame such that heat can be efficiently released from the semiconductor device to the lead frame.

Solution to Problem

To achieve the above-mentioned object, one aspect of the invention provides a semiconductor device defined by (1) to (7) below.

(1) A semiconductor device, comprising:
a lead frame comprising a raised portion on a surface; and
a semiconductor element that is face-down mounted on the lead frame and comprises a substrate comprising a $Ga_2O_3$-based semiconductor, an epitaxial layer comprising a $Ga_2O_3$-based semiconductor and stacked on the substrate, a first electrode connected to a surface of the substrate on an opposite side to the epitaxial layer, and a second electrode connected to a surface of the epitaxial layer on an opposite side to the substrate and comprising a field plate portion at an outer peripheral portion,
wherein the semiconductor element is fixed onto the raised portion, and
wherein an outer peripheral portion of the epitaxial layer, which is located on the outer side of the field plate portion, is located directly above a flat portion of the lead frame that is a portion at which the raised portion is not provided.

(2) The semiconductor device defined by (1), wherein the second electrode is electrically connected to the raised portion through a conductive adhesive, and wherein when the conductive adhesive is located at a position on the flat portion directly below the outer peripheral portion, a distance between the outer peripheral portion and the conductive adhesive located directly below the outer peripheral portion is not less than 3 µm, or when the conductive adhesive is not located at a position on the flat portion directly below the outer peripheral portion, a distance between the outer peripheral portion and the flat portion is not less than 3 µm.

(3) The semiconductor device defined by (1) or (2), wherein the raised portion and the flat portion are integrated.

(4) The semiconductor device defined by (3), wherein the lead frame comprises a recessed portion on a back side of the raised portion.

(5) The semiconductor device defined by (1) or (2), wherein the raised portion and the flat portion are separate pieces that are electrically connected to each other.

(6) A semiconductor device, comprising:
a lead frame; and
a semiconductor element that comprises a substrate comprising a $Ga_2O_3$-based semiconductor, an epitaxial layer comprising a $Ga_2O_3$-based semiconductor and provided on the substrate, a first electrode connected to the substrate side, and a second electrode connected to the epitaxial layer side,
wherein the semiconductor element is face-down mounted on the lead frame, and
wherein a distance between the epitaxial layer and the lead frame is not less than 3 µm.

(7) The semiconductor device defined by any one of (1) to (6), wherein the substrate comprises a recessed portion on a surface on an opposite side to the epitaxial layer, and wherein a bonding wire is connected to the first electrode on a bottom surface of the recessed portion.

Advantageous Effects of Invention

According to the invention, a semiconductor device can be provided in which a vertical semiconductor element formed using a $Ga_2O_3$-based semiconductor as a material of a substrate and an epitaxial layer material is mounted on a lead frame such that heat can be efficiently released from the semiconductor device to the lead frame.

DESCRIPTION OF EMBODIMENTS

First Embodiment

In the first embodiment of the invention, a Schottky barrier diode (SBD) is used as a vertical semiconductor element.

Structure of a Semiconductor Device

Figure 1A:
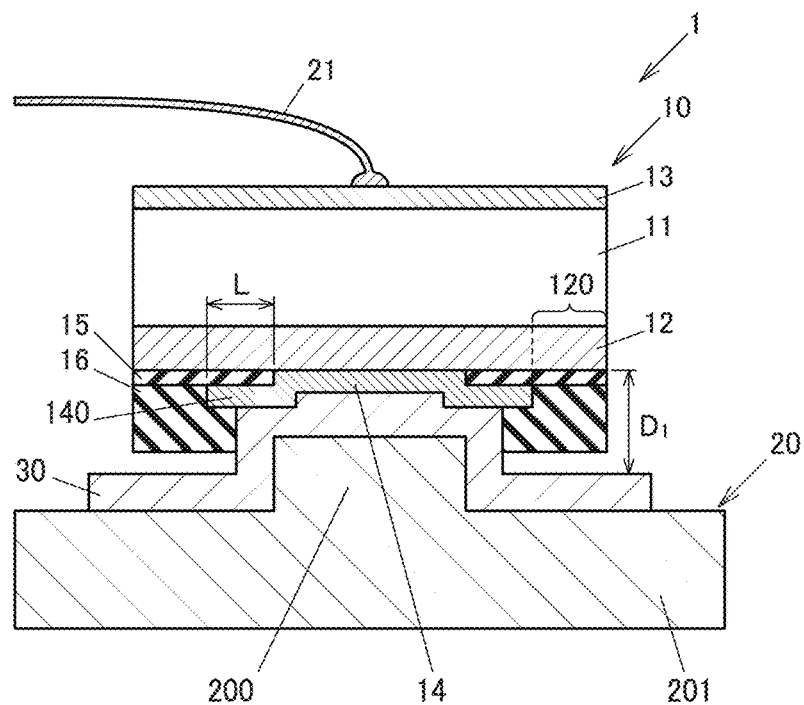
FIG. 1A is a vertical cross-sectional view showing a semiconductor device in the first embodiment.
Figure 1B:
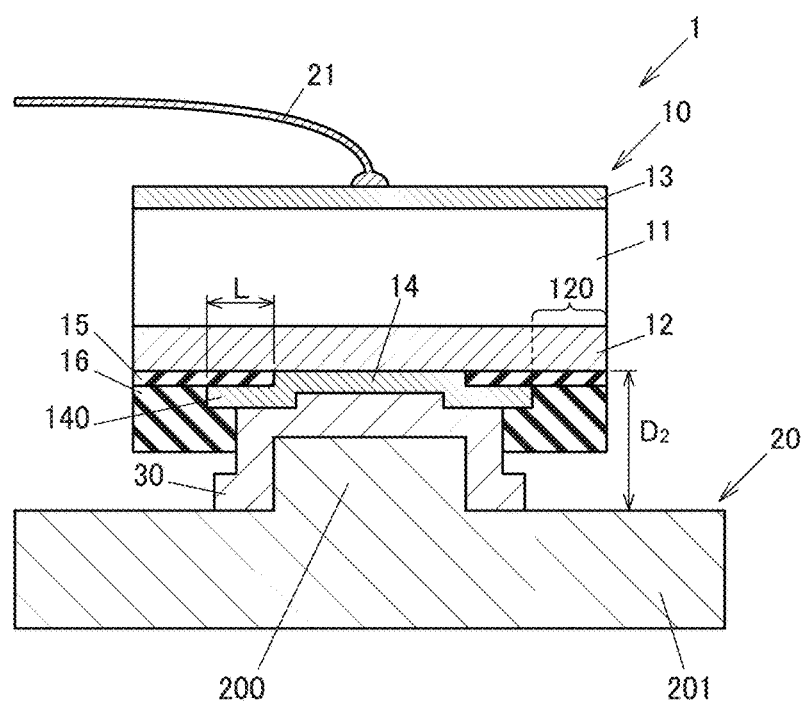
FIG. 1B is a vertical cross-sectional view showing a semiconductor device in the first embodiment.

FIGS. 1A and 1B are vertical cross-sectional views showing semiconductor devices 1 in the first embodiment. The semiconductor device 1 includes a lead frame 20 and an SBD 10 face-down mounted on the lead frame 20. The SBD 10 is fixed and electrically connected to the lead frame 20 by a conductive adhesive 30.

The semiconductor device 1 shown in FIG. 1A and the semiconductor device 1 shown in FIG. 1B are different in ranges where the conductive adhesive 30 covers the lead frame 20. This will be described later.

Hereinafter, the vertical direction of each member of the SBD 10 means the vertical direction when the SBD 10 is mounted. For example, a lower surface of each member is a surface on the lead frame 20 side, and an upper surface is a surface on the opposite side to the lead frame 20.

The lead frame 20 has a raised portion 200 on a surface thereof. A flat portion of the lead frame 20, which is located around the raised portion 200 and on which the raised portion 200 is not provided, is a flat portion 201. The lead frame 20 of the semiconductor device 1 is configured such that the raised portion 200 and the flat portion 201 are integrated. The lead frame 20 is formed of a conductor such as copper or a copper-based alloy.

The SBD 10 has a substrate 11, an epitaxial layer 12 stacked on the substrate 11, a cathode electrode 13 connected to an upper surface (a surface on the opposite side to the epitaxial layer 12) of the substrate 11, and an anode electrode 14 connected to a lower surface (a surface on the opposite side to the substrate 11) of the epitaxial layer 12.

The anode electrode 14 is connected to the raised portion 200 of the lead frame 20 through the conductive adhesive 30, and the cathode electrode 13 is connected, through a bonding wire 21 formed of Al, etc., to a portion of the lead frame 20 which is electrically insulated from the anode electrode 14.

In the SBD 10, a Schottky barrier at an interface between the anode electrode 14 and the epitaxial layer 12 is lowered by applying a forward bias between the anode electrode 14 and the cathode electrode 13, allowing a current to flow from the anode electrode 14 to the cathode electrode 13. On the other hand, when a reverse bias is applied between the anode electrode 14 and the cathode electrode 13, the Schottky barrier at the interface between the anode electrode 14 and the epitaxial layer 12 increases and the current does not flow.

The substrate 11 and the epitaxial layer 12 are formed of a $Ga_2O_3$-based semiconductor and contain an n-type dopant. This n-type dopant is preferably a group IV element such as Si or Sn. An n-type dopant concentration in the substrate 11 is usually higher than an n-type dopant concentration in the epitaxial layer 12.

The $Ga_2O_3$-based semiconductor here is $Ga_2O_3$, or $Ga_2O_3$ containing a substitutional impurity such as Al or In. The $Ga_2O_3$-based semiconductor is preferably a single crystal. The $Ga_2O_3$-based semiconductor is also preferably a β-type crystal.

Using Table 1 below, characteristics of β-$Ga_2O_3$ (β-$Ga_2O_3$) will be described in comparison with characteristics of other semiconductors.

TABLE 1

| | Band gap [eV] | Thermal conductivity [W/(cm · K)] |
|---|---|---|
| Si | 1.1 | 1.5 |
| GaAs | 1.4 | 0.5 |
| GaN | 3.4 | 2.3 |
| SiC | 3.3 | 4.9 |
| β-$Ga_2O_3$ | 4.8 | 0.2 |

As shown in Table 1, $Ga_2O_3$ has a larger band gap than Si, GaAs, GaN and SiC, indicating that it provides excellent breakdown voltage when used as a material for semiconductor element. On the other hand, $Ga_2O_3$ has low thermal conductivity and causes a problem of poor heat dissipation when used as a material for semiconductor element.

Therefore, in the semiconductor device 1 of the first embodiment, the SBD 10 is face-down mounted so that heat generated in the epitaxial layer 12 is released to the lead frame 20 without passing through the thick substrate 11.

Figure 2A:
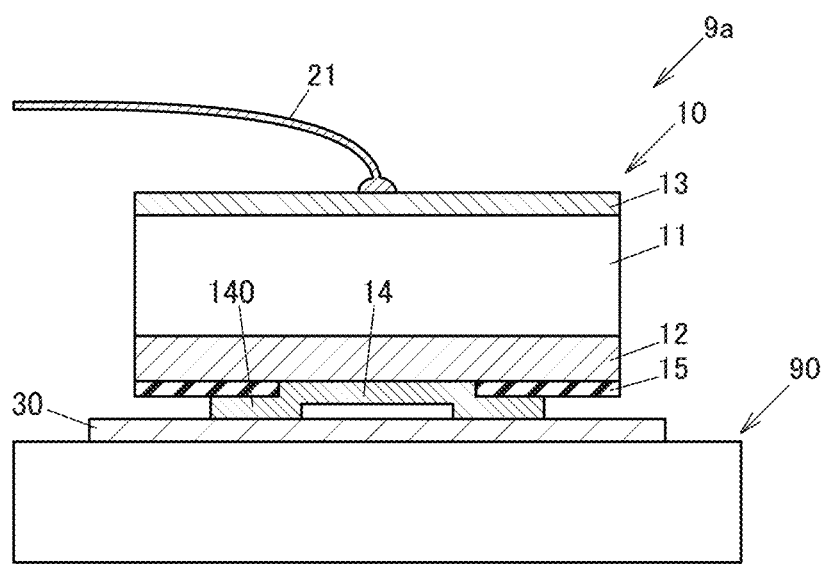
FIG. 2A is a vertical cross-sectional view showing a semiconductor device made as a reference example to evaluate a difference in heat dissipation between when a SBD is face-down mounted and when face-up mounted.
Figure 2B:
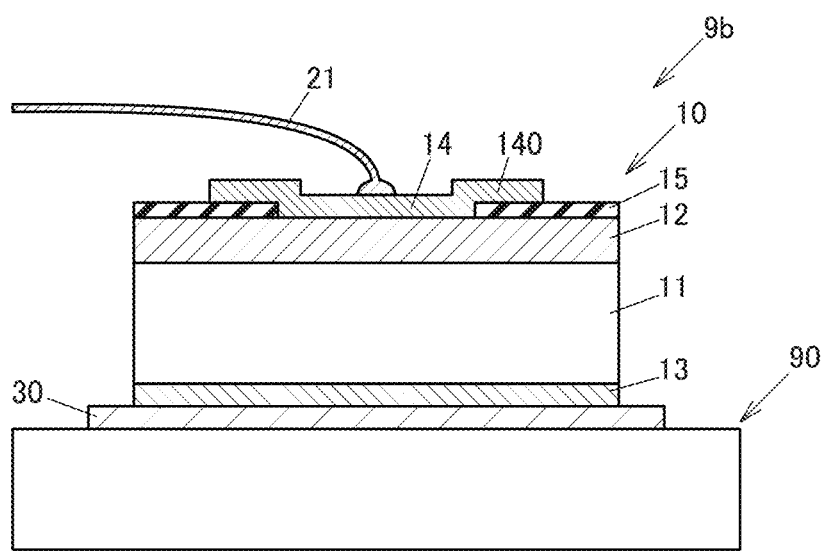
FIG. 2B is a vertical cross-sectional view showing a semiconductor device made as a reference example to evaluate the difference in heat dissipation between when the SBD is face-down mounted and when face-up mounted.

FIGS. 2A and 2B are vertical cross-sectional views showing semiconductor devices 9a and 9b made as reference examples to evaluate a difference in heat dissipation between when the SBD 10 is face-down mounted and when face-up mounted. The SBD 10 is face-down mounted on a lead frame 90 in the semiconductor device 9a, and the SBD 10 is face-up mounted on the lead frame 90 in the semiconductor device 9b.

Figure 3:
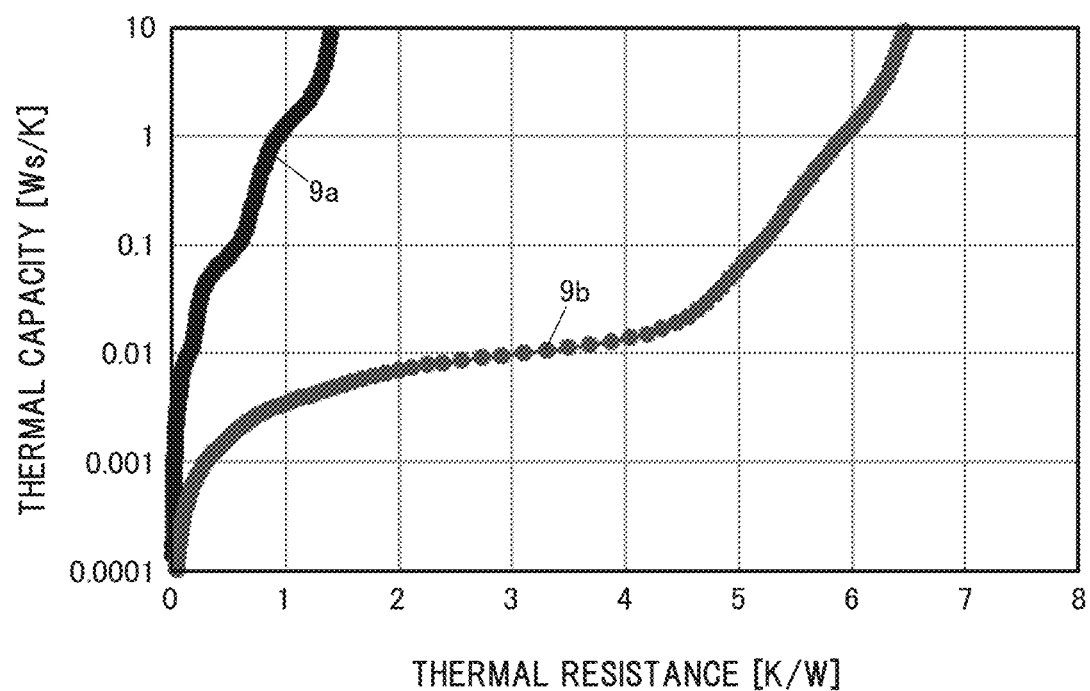
FIG. 3 is a graph showing results of measuring thermal resistance of the semiconductor devices shown in FIGS. 2A and 2B.

FIG. 3 is a graph showing results of measuring thermal resistance of the semiconductor devices 9a and 9b. FIG. 3 shows that a magnitude of thermal resistance with respect to a magnitude of thermal capacitance is significantly smaller for the semiconductor device 9a than for the semiconductor device 9b, and the semiconductor device 9a having the face-down mounted SBD 10 has better heat dissipation.

Meanwhile, since the band gap of the $Ga_2O_3$-based semiconductor is large, electric field intensity inside the epitaxial layer 12 formed of the $Ga_2O_3$-based semiconductor is larger than that in epitaxial layers formed of other semiconductors. For this reason, in the semiconductor device 1 of the first embodiment, a field plate portion 140 is provided on the anode electrode 14 of the SBD 10 to disperse the electric field near an edge of the anode electrode 14 where the electric field is particularly likely to concentrate, thereby suppressing a decrease in breakdown voltage.

The field plate portion 140 of the anode electrode 14 of the SBD 10 here is a portion of an outer peripheral portion of the anode electrode 14 that rides over an insulating film 15, and a length L of the field plate portion 140 is, e.g., 3 to 60 μm. The insulating film 15 is an insulating film formed of $SiO_2$, etc., and provided on the lower surface of the epitaxial layer 12 around the anode electrode 14, and the insulating film 15 is present between the field plate portion 140 and the epitaxial layer 12. A thickness of the insulating film 15 is, e.g., 100 to 10000 nm. An outer peripheral portion and side surface of the field plate portion 140 are covered with an insulator 16 formed of polyimide, plasma SiN, or plasma SiO, etc.

However, when a reverse bias voltage is applied to the SBD 10, charges gather on the surface of the epitaxial layer 12 due to the electric field generated in the conductive adhesive 30 or the lead frame 20 located below the epitaxial layer 12 (the field effect), and if a distance between the epitaxial layer 12 and the conductive adhesive 30 or the lead frame 20 is too small, the electric field intensity on the surface of the epitaxial layer 12 becomes high enough to affect breakdown voltage of the SBD 10.

Thus, in the semiconductor device 1 of the first embodiment, the SBD 10 is fixed in a state of resting on the top of the raised portion 200 of the lead frame 20, and an outer peripheral portion 120 of the epitaxial layer 12, which is located on the outer side of the field plate portion 140, is located directly above the flat portion 201 of the lead frame which is a portion 20 at which the raised portion 200 is not provided. This increases the distance between the outer peripheral portion 120 and the conductive adhesive 30 or the lead frame 20, and a decrease in breakdown voltage of the SBD 10 due to the field effect is thereby suppressed.

Here, $D_1$ is a distance between the outer peripheral portion 120 and the conductive adhesive 30 located directly thereunder when the conductive adhesive 30 is present on the flat portion 201 directly below the outer peripheral portion 120 as shown in FIG. 1A, and $D_2$ is a distance between the outer peripheral portion 120 and the flat portion 201 when the conductive adhesive 30 is not present directly below the outer peripheral portion 120 as shown in FIG. 1B. To more effectively suppress a decrease in breakdown voltage of the SBD 10 due to the field effect, both the distance $D_1$ and the distance $D_2$ are preferably not less than 3 μm.

A thickness of the substrate 11 is, e.g., 30 to 700 μm. A thickness of the epitaxial layer 12 is, e.g., 0.4 to 50 μm.

The cathode electrode 13 is formed of a metal capable of forming an ohmic junction with a $Ga_2O_3$-based semiconductor, such as Ti. The cathode electrode 13 may have a multilayer structure formed by stacking films of different metals, e.g., Ti/Ni/Au or Ti/Al. When having a multilayer structure, a layer in contact with the substrate 11 is formed of a metal capable of forming an ohmic junction with a $Ga_2O_3$-based semiconductor.

The anode electrode 14 is formed of a metal such as Mo, Pt, or Ni. The anode electrode 14 may have a multilayer structure formed by stacking films of different metals, e.g., Mo/Al, Pt/Au, Ni/Au, Ni/Ti/Au or Pt/Al, etc. When, e.g., the conductive adhesive 31 is solder, it is preferable to stack Ti/Ni/Au, etc., as the upper layer of Mo/Al, Pt/Au, Ni/Au, Ni/Ti/Au or Pt/Al.

For example, nano silver paste or solder (e.g., Au—Sn low-melting point solder), etc., is used as the conductive adhesive 30. The nano silver paste with excellent reliability under high-temperature environment is particularly preferable as the conductive adhesive 30. The conductive adhesive 30 is connected to the anode electrode 14 but may not be in contact with the field plate portion 140. In other words, a gap may be present between the conductive adhesive 30 and the field plate 140. Also, a side portion of the raised portion 200 may not be in contact with the conductive adhesive 30. In other words, to electrically connect the raised portion 200 to the anode electrode 14, it is only necessary that an upper portion of the raised portion 200 is in contact with the conductive adhesive 30.

Figure 4A:
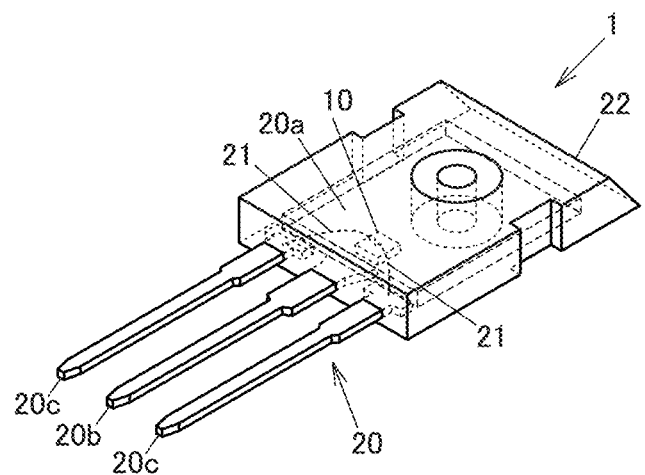
FIG. 4A is a perspective view showing an example of the overall configuration of the semiconductor device as a package in which the SBD is sealed.
Figure 4B:
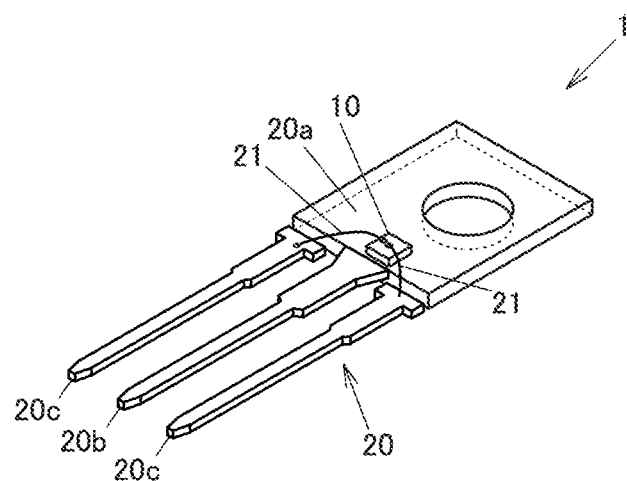
FIG. 4B is a perspective view showing the example of the overall configuration of the semiconductor device as a package in which the SBD is sealed.

FIG. 4A and FIG. 4B are perspective views showing an example of the overall configuration of the semiconductor device 1 as a package in which the SBD 10 is sealed. FIG. 4B is a diagram in which illustration of a molded resin 22 (described later) is omitted.

In this example, the lead frame 20 has a pad portion 20a, a terminal portion 20b electrically connected to the pad portion 20a, and terminal portions 20c insulated from the pad portion 20a.

The anode electrode 14 of the SBD 10 is connected to the pad portion 20a, and the bonding wires 21 are connected to the terminal portions 20c. The pad portion 20a with the SBD 10 mounted thereon and end portions on of the terminal portions 20b and 20c on the pad portion 20a side are sealed with the molded resin 22.

Figure 5:
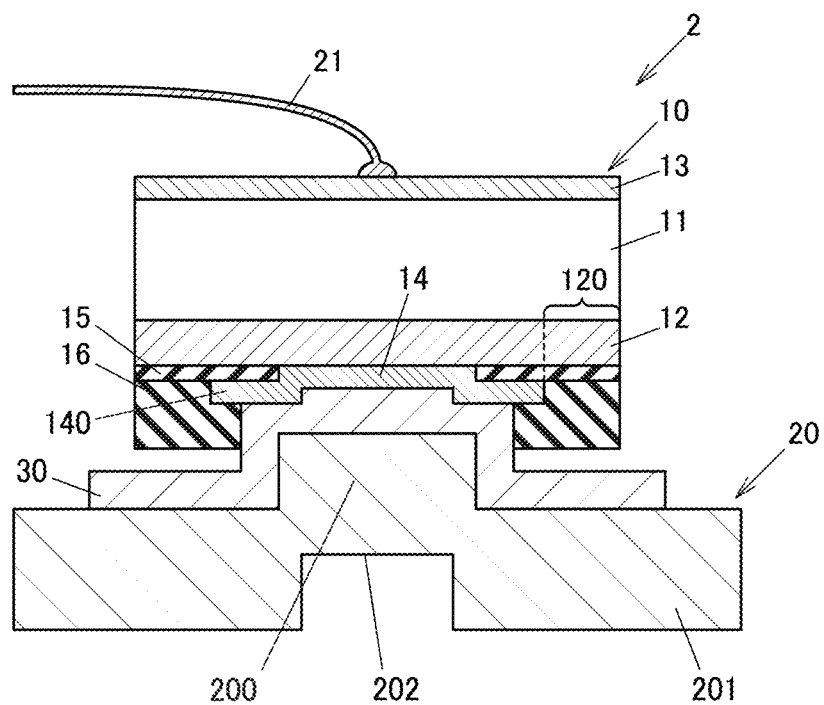
FIG. 5 is a vertical cross-sectional view showing a modification of the semiconductor device in the first embodiment.

FIG. 5 is a vertical cross-sectional view showing a semiconductor device 2 which is a modification of the semiconductor device 1 in the first embodiment. The raised portion 200 of the lead frame 20 of the semiconductor device 2 is formed by pressing. Therefore, the lead frame 20 has a recessed portion 202 on the back side of the raised portion 200.

Second Embodiment

The second embodiment of the invention is different from the first embodiment in the configuration of the lead frame. Note that, description for the same features as those in the first embodiment may be omitted or simplified.

Structure of the Semiconductor Device

Figure 6:
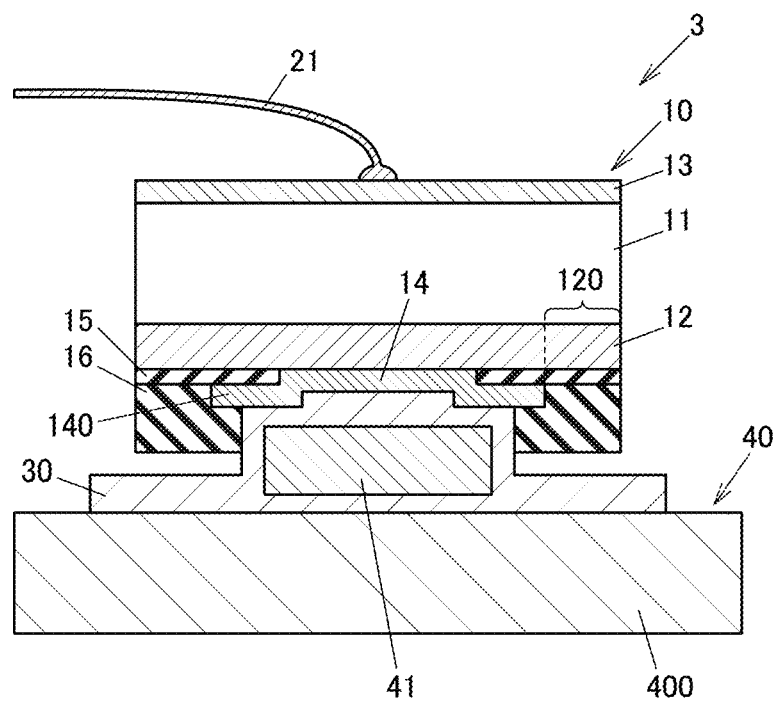
FIG. 6 is a vertical cross-sectional view showing the semiconductor device in the second embodiment.

FIG. 6 is a vertical cross-sectional view showing a semiconductor device 3 in the second embodiment. The semiconductor device 3 includes a lead frame 40 and the SBD 10 face-down mounted on the lead frame 40. The SBD 10 is fixed and electrically connected to the lead frame 40 by the conductive adhesive 30.

The lead frame 40 of the semiconductor device 3 has a conductor 41 as the raised portion. The conductor 41 is a separate piece from a main body 400 serving as the flat portion of the lead frame 40, and is fixed and electrically connected to the main body 400 by the conductive adhesive 30.

The conductor 41 is formed of a material having a higher thermal conductivity than the conductive adhesive 30, such as Cu, and typically has a plate-like shape. Meanwhile, the main body 400 of the lead frame 40 is formed of the same material as the lead frame 20 in the first embodiment.

The conductive adhesive 30 is connected to the anode electrode 14 but may not be in contact with the field plate portion 140. In other words, a gap may be present between the conductive adhesive 30 and the field plate 140. Also a side portion of the conductor 41 may not be in contact with the conductive adhesive 30. In other words, to electrically connect the conductor 41 to the anode electrode 14 and the lead frame 40, it is only necessary that upper and lower portions of the conductor 41 are in contact with the conductive adhesive 30.

Figure 7A:
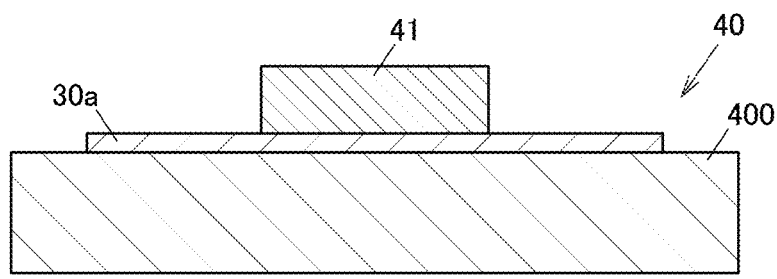
FIG. 7A is a vertical cross-sectional view showing an example of a process of mounting the SBD on the lead frame in the second embodiment.
Figure 7B:
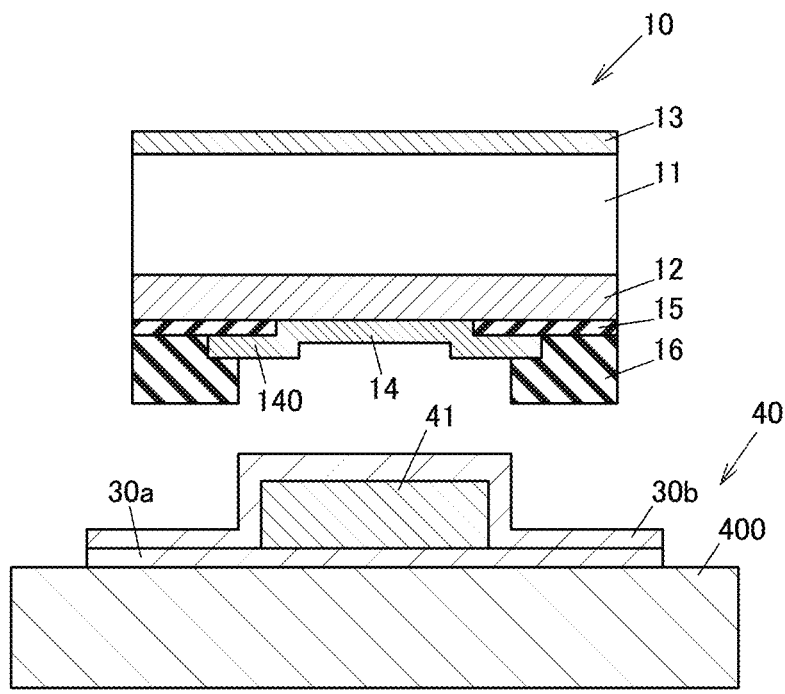
FIG. 7B is a vertical cross-sectional view showing the example of the process of mounting the SBD on the lead frame in the second embodiment.
Figure 7C:
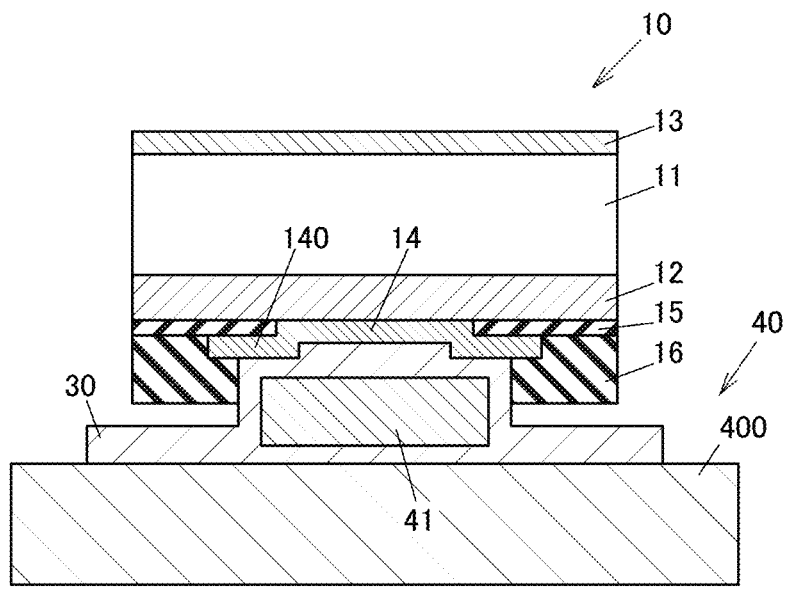
FIG. 7C is a vertical cross-sectional view showing the example of the process of mounting the SBD on the lead frame in the second embodiment.

FIGS. 7A to 7C are vertical cross-sectional views showing an example of a process of mounting the SBD 10 on the lead frame 40 in the second embodiment.

Firstly, as shown in FIG. 7A, the conductor 41 is connected to the main body 400 of the lead frame 40 by a conductive adhesive 30a. The conductive adhesive 30a here is a portion of the conductive adhesive 30 and is used to connect the conductor 41 to the main body 400.

Next, as shown in FIG. 7B, the surface of the conductor 41 is covered with a conductive adhesive 30b. The conductive adhesive 30b here is a portion of the conductive adhesive 30 and is used to connect the SBD 10 to the lead frame 40.

Next, as shown in FIG. 7C, the SBD 10 is connected to the lead frame 40 having the conductor 41 as the raised portion. In this regard, the method of connecting the conductor 41 to the main body 400 and the method of connecting the SBD 10 to the lead frame 40 are not limited to the methods shown in FIGS. 7A to 7C, and also the method of forming the conductive adhesive 30 in which the conductive adhesive 30a and the conductive adhesive 30b are separately formed is only an example. For example, after bonding the conductor 41 to the anode electrode 14 using a conductive adhesive, etc., the SBD 10 to which the conductor 41 is bonded may be bonded to the lead frame 40 using a conductive adhesive, etc.

Third Embodiment

Figure 8:
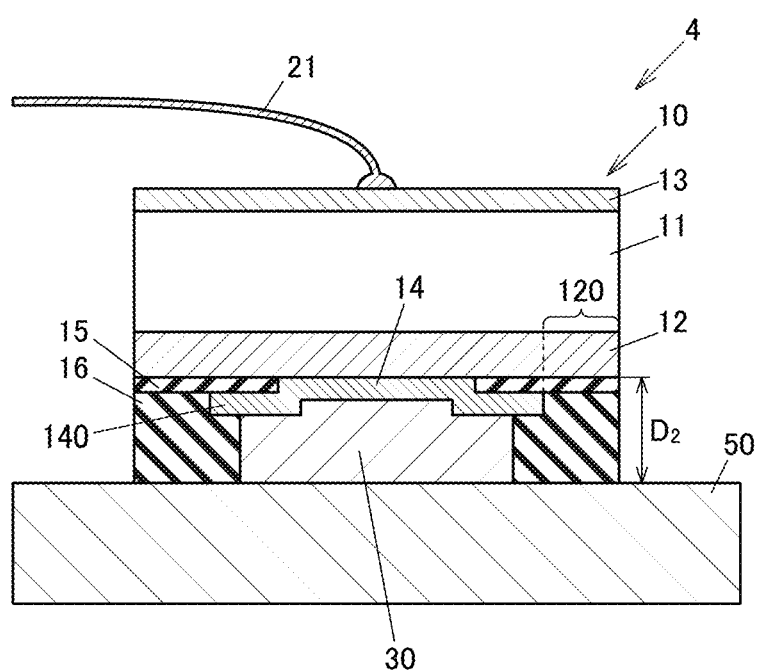
FIG. 8 is a vertical cross-sectional view showing the semiconductor device in the third embodiment.

The third embodiment of the invention is different from the first embodiment in that the distance between the epitaxial layer and the lead frame is increased without providing the raised portion on the lead frame. Note that, description for the same features as those in the first embodiment may be omitted or simplified.
Structure of the Semiconductor Device FIG. 8 is a vertical cross-sectional view showing a semiconductor device 4 in the third embodiment. The semiconductor device 4 includes a lead frame 50 and the SBD 10 face-down mounted on the lead frame 50. The SBD 10 is fixed and electrically connected to the lead frame 50 by the conductive adhesive 30.

In the semiconductor device 4, the SBD 10 is connected to a flat portion of the lead frame 50, and the distance $D_2$ between the outer peripheral portion 120 and the lead frame 50 is increased by increasing a thickness of the conductive adhesive 30 that electrically connects the SBD 10 to the lead frame 50. The distance $D_2$ is preferably not less than 3 μm, in the same manner as the semiconductor device 1 in the first embodiment.

To increase the distance $D_2$, the thickness of the conductive adhesive 30 can be increased while ensuring stability of the SBD 10 on the lead frame 50, by increasing a thickness of the insulator 16 and using the insulator 16 to support the SBD 10 as shown in FIG. 8. In this case, the sum of the thickness of the insulating film 15 and the thickness of the insulator 16 is substantially equal to the distance $D_2$.

The conductive adhesive 30 is connected to the anode electrode 14 but may not be in contact with the field plate portion 140. In other words, a gap may be present between the conductive adhesive 30 and the field plate portion 140.

Fourth Embodiment

Figure 9:
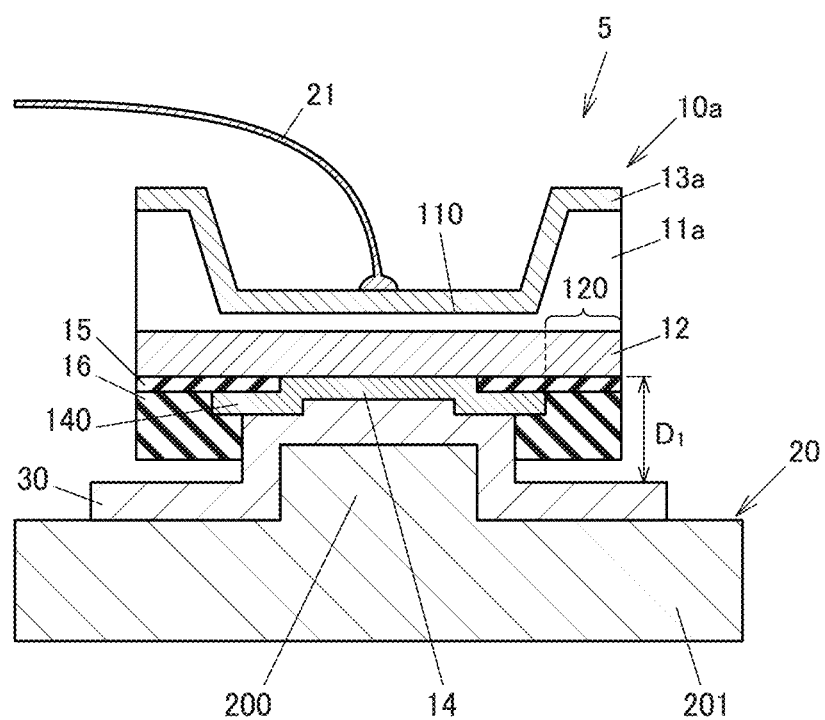
FIG. 9 is a vertical cross-sectional view showing the semiconductor device in the fourth embodiment.

The fourth embodiment of the invention is different from the first embodiment in that a recessed portion is provided on the upper surface of the substrate. Note that, description for the same features as those in the first embodiment may be omitted or simplified.
Structure of the Semiconductor Device FIG. 9 is a vertical cross-sectional view showing a semiconductor device 5 in the fourth embodiment. The semiconductor device 5 includes the lead frame 20 and a SBD 10a face-down mounted on the lead frame 20. The SBD 10a is fixed and electrically connected to the lead frame 20 by the conductive adhesive 30.

In the semiconductor device 5, a recessed portion 110 is formed on an upper surface (a surface on the opposite side to the epitaxial layer 12) of a substrate 11a, a cathode electrode 13a is formed on the upper surface of the substrate 11a including an inner surface of the recessed portion 110, and the bonding wire 21 is connected to the cathode electrode 13a on a bottom surface of the recessed portion 110.

By providing the recessed portion 110 on the substrate 11a, a distance between the epitaxial layer 12 and the cathode electrode 13a is reduced and heat generated in the epitaxial layer 12 can be efficiently released also from the cathode electrode 13a side. The heat transferred to the cathode electrode 13a is dissipated from the bonding wire 21, etc., to the outside of the SBD 10a.

A portion of the substrate 11a at which the recessed portion 110 is not provided has the same thickness as the substrate 11 in the first embodiment (e.g., 150 to 600 μm). Therefore, a decrease in mechanical strength can be suppressed when forming the recessed portion 110 as compared to when the substrate is thinned by polishing the whole surface. A thickness of the portion of the substrate 11a at which the recessed portion 110 is not provided (a distance between a bottom of the recessed portion 110 and a lower surface of the substrate 11a) is, e.g., 10 to 250 μm.

The SBD 10a in the fourth embodiment may be mounted on the flat portion of the lead frame 50 by the method in the third embodiment.

Fifth Embodiment

Figure 10:
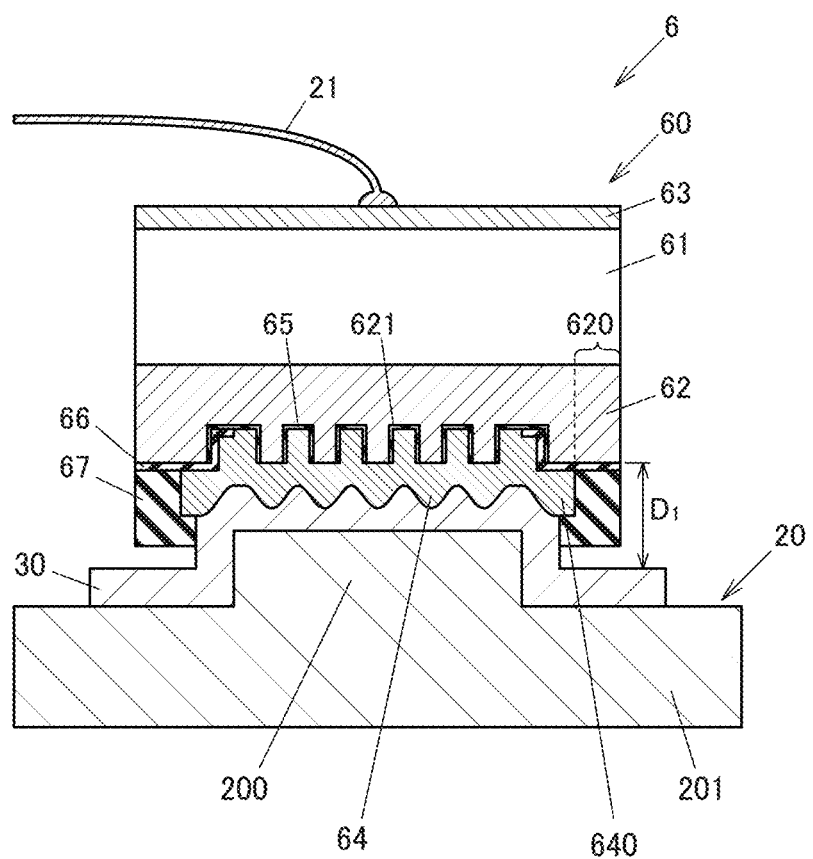
FIG. 10 is a vertical cross-sectional view showing the semiconductor device in the fifth embodiment.

The fifth embodiment of the invention is different from the first embodiment in that a trench SBD is used as a vertical semiconductor element. Note that, description for the same features as those in the first embodiment may be omitted or simplified.
Structure of the Semiconductor Device FIG. 10 is a vertical cross-sectional view showing a semiconductor device 6 in the fifth embodiment. The semiconductor device 6 includes the lead frame 20 and a trench SBD 60 face-down mounted on the lead frame 20. The trench SBD 60 is fixed onto and electrically connected to the raised portion 200 of the lead frame 20 by the conductive adhesive 30.

The trench SBD 60 has a substrate 61, an epitaxial layer 62 stacked on the substrate 61, trenches 621 formed on a lower surface (a surface on the opposite side to the substrate 61) of the epitaxial layer 62, insulating films 65 covering inner surfaces of the trenches 621, an insulating film 66 covering the inner surfaces of the outer trenches 621 and an outer peripheral portion of the lower surface of the epitaxial layer 62, an anode electrode 64 that is formed on the lower surface of the epitaxial layer 62 so as to fill the trenches 621 and is in Schottky contact with the epitaxial layer 62, an insulator 67 covering a side surface of the anode electrode 64, and a cathode electrode 63 that is formed on an upper surface (a surface on the opposite side to the epitaxial layer 62) of the substrate 61 and is in ohmic contact with the substrate 61.

The substrate 61 and the epitaxial layer 62 are formed of a $Ga_2O_3$-based semiconductor, in the same manner as the substrate 11 and the epitaxial layer 12 in the first embodiment.

The anode electrode 64 and the cathode electrode 63 can be respectively formed of the same materials as the anode electrode 14 and the cathode electrode 13 in the first embodiment. The anode electrode 64 is connected to the lead frame 20 through the conductive adhesive 30, and the cathode electrode 63 is connected, through the bonding wire 21, to a portion of the lead frame 20 which is electrically insulated from the anode electrode 64.

Since the trench SBD 60 in the fifth embodiment is also face-down mounted in the same manner as the SBD 10 in the first embodiment, heat generated in the epitaxial layer 62 can be released to the lead frame 20 without passing through the thick substrate 61.

In addition, a field plate portion 640 is provided on the anode electrode 64 of the trench SBD 60 to disperse the electric field near an edge of the anode electrode 64 where the electric field is particularly likely to concentrate, thereby suppressing a decrease in breakdown voltage.

The field plate portion 640 of the anode electrode 64 here is a portion of an outer peripheral portion of the anode electrode 64 which is located on the outer side of the trenches 621, and an outer peripheral portion and side surface of the field plate portion 640 are covered with the insulator 67 formed of polyimide, plasma SiN, or plasma SiO, etc.

In the semiconductor device 6, an outer peripheral portion 620 of the epitaxial layer 62, which is located on the outer side of the field plate portion 640, is located directly above the flat portion 201 of the lead frame 20 which is a portion at which the raised portion 200 is not provided. This increases the distance between the outer peripheral portion 620 and the conductive adhesive 30 or the lead frame 20, and a decrease in breakdown voltage of the trench SBD 60 due to the field effect is thereby suppressed.

$D_1$, which is a distance between the outer peripheral portion 620 and the conductive adhesive 30 located directly thereunder when the conductive adhesive 30 is present on the flat portion 201 directly below the outer peripheral portion 620, and $D_2$, which is a distance between the outer peripheral portion 620 and the flat portion 201 when the conductive adhesive 30 is not present directly below the outer peripheral portion 620, are both preferably not less than 3 μm.

The trench SBD 60 in the fifth embodiment may be mounted on the flat portion of the lead frame 50 by the method in the third embodiment. That is, to increase the distance $D_2$, the thickness of the conductive adhesive 30 may be increased while ensuring stability of the trench SBD 60 on the lead frame 50, by increasing a thickness of the insulator 67 and using the insulator 67 to support the trench SBD 60.

In addition, a recessed portion similar to the recessed portion 110 of the substrate 11a in the first embodiment may be formed on the substrate 61 of the trench SBD 60, followed by forming the cathode electrode 63 on the upper surface of the substrate 61 including the inner surface of the recessed portion, and then connecting the bonding wire 21 to the cathode electrode 63 on a bottom surface of the recessed portion.

In addition, the conductive adhesive 30 is connected to the anode electrode 64 but may not be in contact with the field plate portion 640. In other words, a gap may be present between the conductive adhesive 30 and the field plate portion 640.

Sixth Embodiment

The sixth embodiment of the invention is different from the first embodiment in that a junction field effect transistor (JFET) is used as a vertical semiconductor element. Note that, description for the same features as those in the first embodiment may be omitted or simplified.

Structure of the Semiconductor Device

Figure 11:
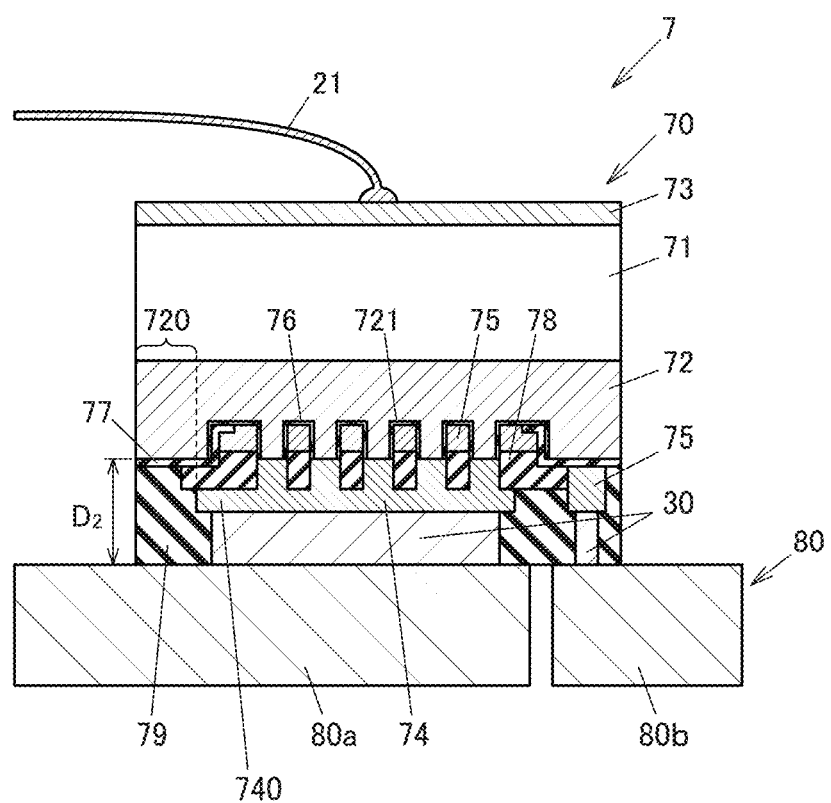
FIG. 11 is a vertical cross-sectional view showing the semiconductor device in the sixth embodiment.

FIG. 11 is a vertical cross-sectional view showing a semiconductor device 7 in the sixth embodiment. The semiconductor device 7 includes a lead frame 80 and a JFET 70 face-down mounted on the lead frame 80. The JFET 70 is fixed and electrically connected to the lead frame 80 by the conductive adhesive 30.

The JFET 70 has a substrate 71, an epitaxial layer 72 stacked on the substrate 71, trenches 721 formed on a lower surface (a surface on the opposite side to the substrate 71) of the epitaxial layer 72, insulating films 76 covering inner surfaces of the trenches 721, an insulating film 77 covering the inner surfaces of the outer trenches 721 and an outer peripheral portion of the lower surface of the epitaxial layer 72, a gate electrode 75 with portions buried in the trenches 721, insulators 78 covering the portions of the gate electrode 75 buried in the trenches 721, a source electrode 74 that is formed on the epitaxial layer 72 and the insulator 78 and is in Schottky contact with the epitaxial layer 72, an insulator 79 covering a portion of the gate electrode 75 exposed on the insulating film 77 and a side surface of the source electrode 74, and a drain electrode 73 that is formed on an upper surface (a surface on the opposite side to the epitaxial layer 72) of the substrate 71 and is in ohmic contact with the substrate 71.

The substrate 71 and the epitaxial layer 72 are formed of a $Ga_2O_3$-based semiconductor, in the same manner as the substrate 11 and the epitaxial layer 12 in the first embodiment.

The source electrode 74 and the drain electrode 73 can be respectively formed of the same materials as the anode electrode 14 and the cathode electrode 13 in the first embodiment. The gate electrode 75 is formed of a conductor such as polycrystalline Si doped with Ni, Cr, Pt, Al, Au, or phosphorus.

The lead frame 80 has a portion 80a connected to the source electrode 74 and a portion 80b connected to the gate electrode 75, and the portions 80a and 80b are electrically insulated from each other. The bonding wire 21 connected to the drain electrode 73 is connected to a portion of the lead frame 80 electrically insulated from the portions 80a and 80b.

Since the JFET 70 in the sixth embodiment is also face-down mounted in the same manner as the SBD 10 in the first embodiment, heat generated in the epitaxial layer 72 can be released to the lead frame 80 without passing through the thick substrate 71.

In addition, a field plate portion 740 is provided on the source electrode 74 of the JFET 70 to disperse the electric field near an edge of the source electrode 74 where the electric field is particularly likely to concentrate, thereby suppressing a decrease in breakdown voltage.

The field plate portion 740 of the source electrode 74 here is a portion of an outer peripheral portion of the source electrode 74 that rides over the insulator 78, and an outer peripheral portion and side surface of the field plate portion 740 are covered with the insulator 79 formed of polyimide, plasma SiN, or plasma SiO, etc.

In addition, in the semiconductor device 7, the JFET 70 is connected to the flat portion of the lead frame 80, and the distance $D_2$ between the lead frame 80 and an outer peripheral portion 720 of the epitaxial layer 72 located on the outer side of the field plate portion 740 is increased by increasing the thickness of the conductive adhesive 30 that electrically connects the JFET 70 to the lead frame 80. The distance $D_2$ is preferably not less than 3 μm, in the same manner as the semiconductor device 1 in the first embodiment.

To increase the distance $D_2$, the thickness of the conductive adhesive 30 can be increased while ensuring stability of the JFET 70 on the lead frame 80, by increasing a thickness of the insulator 79 and using the insulator 79 to support the JFET 70 as shown in FIG. 11. In this case, the sum of the thickness of the insulating film 77 and the thickness of the insulator 79 is substantially equal to the distance $D_2$.

A recessed portion similar to the recessed portion 110 of the substrate 11a in the first embodiment may be formed on the substrate 71 of the JFET 70, followed by forming the drain electrode 73 on the upper surface of the substrate 71 including the inner surface of the recessed portion, and then connecting the bonding wire 21 to the drain electrode 73 on a bottom surface of the recessed portion.

In addition, the conductive adhesive 30 is connected to the source electrode 74 but may not be in contact with the field plate portion 740. In other words, a gap may be present between the conductive adhesive 30 and the field plate portion 740.

Effects of the Embodiments

In the first to sixth embodiments, by face-down mounting the vertical semiconductor element formed using a $Ga_2O_3$-based semiconductor and also by increasing a distance between the outer peripheral portion of the epitaxial layer and the lead frame or the conductive adhesive directly thereunder, it is possible to improve heat dissipation of the semiconductor element while suppressing a decrease in breakdown voltage due to the field effect.

Although the embodiments of the invention have been described, the invention is not intended to be limited to the embodiments, and the various kinds of modifications can be implemented without departing from the gist of the invention. For example, even when another semiconductor element such as a vertical MOSFET or a MISFET is used as the vertical semiconductor element, similar effects can be obtained by the same method as those in the first to sixth embodiments in which the SBD, etc., is used. In addition, in each embodiment, a clip formed of Cu, etc., or a ribbon formed of Al, etc., may be used in place of the bonding wire 21.

In addition, the constituent elements in the embodiments can be arbitrarily combined without departing from the gist of the invention. In addition, the invention according to claims is not to be limited to the embodiments described above. Further, it should be Note that not all combinations of the features described in the embodiments are necessary to solve the problem of the invention.

INDUSTRIAL APPLICABILITY

Provided is a semiconductor device in which a vertical semiconductor element formed using a $Ga_2O_3$-based semiconductor as a material of a substrate and an epitaxial layer material is mounted on a lead frame, and heat can be efficiently released from the semiconductor device to the lead frame.

REFERENCE SIGNS LIST 1, 2, 3, 4, 5, 6, 7 SEMICONDUCTOR DEVICE
10 SBD
11, 11a, 61, 71 SUBSTRATE
110 RECESSED PORTION
12, 62, 72 EPITAXIAL LAYER
120, 620, 720 OUTER PERIPHERAL PORTION
14, 64 ANODE ELECTRODE
140, 640 FIELD PLATE PORTION
13, 13a, 63 CATHODE ELECTRODE
21 BONDING WIRE
20, 40, 50, 80 LEAD FRAME
200 RAISED PORTION
201 FLAT PORTION
202 RECESSED PORTION
41 CONDUCTOR
74 SOURCE ELECTRODE
740 FIELD PLATE PORTION
73 DRAIN ELECTRODE

The invention claimed is:

1. A semiconductor device, comprising:
   a lead frame comprising a raised portion on a surface thereof; and
   a semiconductor element that is face-down mounted on the lead frame and comprises a substrate comprising a $Ga_2O_3$-based semiconductor, an epitaxial layer comprising a $Ga_2O_3$-based semiconductor and stacked on the substrate, a first electrode connected to a surface of the substrate on an opposite side to the epitaxial layer, and a second electrode connected to a surface of the epitaxial layer on an opposite side to the substrate and comprising a field plate portion at an outer peripheral portion,
   wherein the semiconductor element is fixed onto the raised portion, and
   wherein an outer peripheral portion of the epitaxial layer, which is located on the outer side of the field plate portion, is located directly above a flat portion of the lead frame that is a portion at which the raised portion is not provided.

2. The semiconductor device according to claim 1, wherein the second electrode is electrically connected to the raised portion through a conductive adhesive, and wherein when the conductive adhesive is located at a position on the flat portion directly below the outer peripheral portion, a distance between the outer peripheral portion and the conductive adhesive located directly below the outer peripheral portion is not less than 3 μm, or when the conductive adhesive is not located at a position on the flat portion directly below the outer peripheral portion, a distance between the outer peripheral portion and the flat portion is not less than 3 μm.

3. The semiconductor device according to claim 1, wherein the raised portion and the flat portion are integrated.

4. The semiconductor device according to claim 3, wherein the lead frame comprises a recessed portion on a back side of the raised portion.

5. The semiconductor device according to claim 1, wherein the raised portion and the flat portion are separate pieces that are electrically connected to each other.

6. A semiconductor device, comprising:
a lead frame; and
a semiconductor element that comprises a substrate comprising a $Ga_2O_3$-based semiconductor, an epitaxial layer comprising a $Ga_2O_3$-based semiconductor and provided on the substrate, a first electrode connected to the substrate side, and a second electrode connected to the epitaxial layer side,
wherein the semiconductor element is face-down mounted on the lead frame, and
wherein a distance between the epitaxial layer and the lead frame is not less than 3 µm.

7. The semiconductor device according to claim 1, wherein the substrate comprises a recessed portion on a surface on an opposite side to the epitaxial layer, and wherein a bonding wire is connected to the first electrode on a bottom surface of the recessed portion.

8. The semiconductor device according to claim 1, wherein the lead frame is formed of a conductor.

9. The semiconductor device according to claim 2, wherein the raised portion is formed of a conductor.

10. The semiconductor device according to claim 3, wherein the raised portion and the flat portion are formed of a conductor.

11. The semiconductor device according to claim 4, wherein the raised portion and the flat portion are formed of conductors.

12. The semiconductor device according to claim 1, wherein the second electrode is in Schottky contact with the epitaxial layer.

13. The semiconductor device according to claim 6, wherein the second electrode is in Schottky contact with the epitaxial layer.

* * * * *